United States Patent
Hwang

(10) Patent No.: US 8,004,027 B2
(45) Date of Patent: *Aug. 23, 2011

(54) IMAGE SENSOR AND MANUFACTURING METHOD THEREOF

(75) Inventor: Joon Hwang, Cheongju-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 295 days.

This patent is subject to a terminal disclaimer.

(21) Appl. No.: 12/204,856

(22) Filed: Sep. 5, 2008

(65) Prior Publication Data

US 2009/0065825 A1    Mar. 12, 2009

(30) Foreign Application Priority Data

Sep. 6, 2007    (KR) .................. 10-2007-0090645
Jun. 10, 2008    (KR) .................. 10-2008-0054360

(51) Int. Cl.
*H01L 31/112* (2006.01)
*H01L 31/00* (2006.01)

(52) U.S. Cl. . 257/292; 257/294; 257/290; 257/E21.079; 438/98; 438/69; 438/75

(58) Field of Classification Search .................. 257/290, 257/291, 292, E31.079, E31.001, 294, 458; 438/98, 69, 75

See application file for complete search history.

(56) References Cited

U.S. PATENT DOCUMENTS

| 6,798,033 | B2 | 9/2004 | Chao et al. | |
| 7,675,101 | B2 * | 3/2010 | Hwang | 257/292 |
| 2003/0213915 | A1 | 11/2003 | Chao et al. | |
| 2007/0018266 | A1 | 1/2007 | Dupont et al. | |
| 2010/0013907 | A1 | 1/2010 | Lee | |
| 2011/0053332 | A1 | 3/2011 | Lee | |

FOREIGN PATENT DOCUMENTS

| KR | 10-2004-0058691 A | 7/2004 |
| KR | 10-2005-0117674-4 | 12/2005 |
| KR | 10-2006-0003201 A | 1/2006 |
| KR | 10-2007-0000578 A | 10/2007 |

OTHER PUBLICATIONS

Office Action dated Apr. 26, 2011 in German Application No. 102008046034, filed Sep. 5, 2008.

* cited by examiner

*Primary Examiner* — Thinh T Nguyen
(74) *Attorney, Agent, or Firm* — Saliwanchik, Lloyd & Eisenschenk

(57) ABSTRACT

Provided is an image sensor. The image sensor comprises an interlayer dielectric, lines, and a crystalline semiconductor layer including photodiodes and a device isolation region. The interlayer dielectric can be formed on a first substrate comprising a readout circuitry. The lines pass through the interlayer dielectric to connect with the readout circuitry, and each line is formed according to unit pixel. The crystalline semiconductor layer can be bonded on the interlayer dielectric including the lines. The photodiodes, formed inside the crystalline semiconductor layer, are electrically connected with the lines. The device isolation region comprises conductive impurities and is formed inside the crystalline semiconductor layer so that the photodiodes can be separated according to unit pixels.

20 Claims, 5 Drawing Sheets

IMAGE SENSOR AND MANUFACTURING METHOD THEREOF

CROSS-REFERENCE TO RELATED APPLICATIONS

The present application claims the benefit under 35 U.S.C. §119 of Korean Patent Application No. 10-2007-0090645, filed Sep. 6, 2007, and No. 10-2008-0054360, filed Jun. 10, 2008, which are hereby incorporated by reference in their entirety.

BACKGROUND

An image sensor is a semiconductor device for converting an optical image into an electrical signal. The image sensor is roughly classified as a charge coupled device (CCD) image sensor or a complementary metal oxide semiconductor (CMOS) image sensor (CIS).

In an image sensor, a photodiode is typically formed in a substrate with transistor circuitry using ion implantation. As the size of a photodiode reduces more and more for the purpose of increasing the number of pixels without an increase in a chip size, the area of a light receiving portion reduces, so that an image quality reduces.

Also, since a stack height does not reduce as much as the reduction in the area of the light receiving portion, the number of photons incident to the light receiving portion also reduces due to diffraction of light, called airy disk.

As an alternative to overcome this limitation, an attempt of forming a photodiode using amorphous silicon (Si), or forming a readout circuitry in a Si substrate and forming a photodiode on the readout circuitry using a method such as wafer-to-wafer bonding has been made (referred to as a "three-dimensional (3D) image sensor). The photodiode is connected with the readout circuitry through a metal line.

However, according to a related art, when a trench is formed and an isolation region is formed using an etching process to form the photodiode for each unit pixel, a defect may be generated on the surface of the photodiode by the etching process, so that a dark current may be caused.

Meanwhile, according to a related art, when the surface voltage of the photodiode is lowered by incident light, the surface voltage of a voltage sensing portion is also lowered simultaneously. After that, when a transfer transistor Tx is opened and then closed, voltages of the source and the drain of the transfer transistor become equal to each other, and a potential difference of the drain is amplified through a drive transistor. According to the related art, since the both the source and the drain of the transfer transistor are heavily doped with N-type impurities, a charge sharing phenomenon occurs. When the charge sharing phenomenon occurs, the sensitivity of an output image is reduced and an image error may be generated.

Also, according to the related art, because a photo charge does not swiftly move between the photodiode and the readout circuitry, a dark current is generated or saturation and sensitivity are reduced.

BRIEF SUMMARY

Embodiments of the present invention provide an image sensor that can resolve a dark current characteristic by forming a device isolation region for isolation of a photodiode for each unit pixel through implantation of impurities while increasing a fill factor, and a manufacturing method thereof.

Embodiments also provide an image sensor that can inhibit a charge sharing phenomenon from occurring while increasing a fill factor, and a manufacturing method thereof.

Embodiments also provide an image sensor that can minimize a dark current source by providing a swift movement path of a photo charge between a photodiode and a readout circuitry, and can inhibit reduction in saturation and sensitivity, and a manufacturing method thereof.

In one embodiment, an image sensor can comprise: an interlayer dielectric on a first substrate comprising a readout circuitry; lines passing through the interlayer dielectric to connect with the readout circuitry, the lines being formed for each unit pixel; a crystalline semiconductor layer on the interlayer dielectric; photodiodes inside the crystalline semiconductor layer, the photodiodes electrically connected with corresponding ones of the lines; and a device isolation region comprising conductive impurities, the device isolation region being formed inside the crystalline semiconductor layer so that the photodiodes are separated according to unit pixels.

In another embodiment, a method for manufacturing an image sensor comprises: forming a readout circuitry on a first substrate; forming an interlayer dielectric on the first substrate comprising the readout circuitry; forming a line connected with the readout circuitry in the interlayer dielectric; preparing a second substrate comprising a crystalline semiconductor layer; forming photodiodes inside the crystalline semiconductor layer; implanting conductive impurities into the crystalline semiconductor layer to form a device isolation region such that the photodiodes are separated according to unit pixels; bonding the first substrate and the second substrate so that the line of the first substrate is electrically connected with a corresponding photodiode of the photodiodes of the crystalline semiconductor layer; and removing a portion of the second substrate such that the crystalline semiconductor layer remains on the first substrate.

The details of one or more embodiments are set forth in the accompanying drawings and the description below. Other features will be apparent from the description and drawings, and from the claims.

DETAILED DESCRIPTION

Embodiments of an image sensor and a manufacturing method thereof according to an embodiment will be described with reference to the accompanying drawings.

When the terms "on" or "over" are used herein, when referring to layers, regions, patterns, or structures, it is understood that the layer, region, pattern or structure can be directly on another layer or structure, or intervening layers, regions, patterns, or structures may also be present. When the terms "under" or "below" are used herein, when referring to layers, regions, patterns, or structures, it is understood that the layer, region, pattern or structure can be directly under the other layer or structure, or intervening layers, regions, patterns, or structures may also be present.

Figure 11:
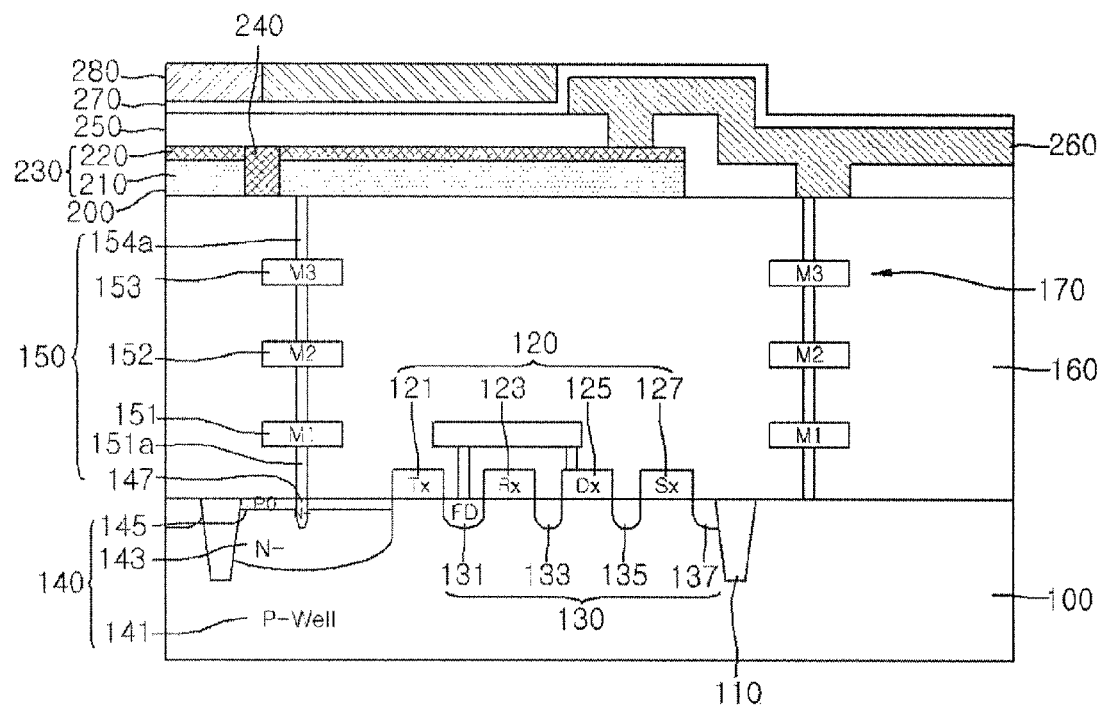

FIG. 11 is a cross-sectional view of an image sensor according to an embodiment.

Referring to FIG. 11, an image sensor can include: an interlayer dielectric 160 on a first substrate 100 including readout circuitry 120; a line 150 passing through the interlayer dielectric 160 to connect with the readout circuitry 120, the line 150 being formed for each unit pixel; a crystalline semiconductor layer 200 on the interlayer dielectric 160 including the line 150; photodiodes 230 inside the crystalline semiconductor layer 200, one of the photodiodes 230 electrically connected with the line 150; and a device isolation region 240 including conductive impurities, the device isolation region being formed inside the crystalline semiconductor layer 200 so that the photodiodes 230 are separated according to unit pixels.

The readout circuitry 120 of the first substrate 100 can include an electrical junction region 140 formed in the first substrate 100; and a first conduction type connection region 147 connected with the line 150 on the electrical junction region 140.

A photodiode 230 including a first impurity region 210 (n-type) and a second impurity region 220 (p-type) can be formed inside the crystalline semiconductor layer 200.

The device isolation region 240 can be disposed at sides of the photodiode 230. In one embodiment, the device isolation region 240 can be formed of high concentration p-type impurity P+.

A first passivation layer 250 having a first trench 253 can be disposed on the photodiode 230. Also, an upper electrode 260 connected with the photodiode 230 can be disposed on the photodiode 230 and contact the photodiode through the first trench. The upper electrode 260 can be provided on a portion of the photodiode 230 through the first trench 253 at an edge of the photodiode 230 such that the light receiving region of the photodiode can be secured as much as possible.

A second passivation layer 270 can be disposed on the photodiode 230 and the upper electrode 260. A color filter 280 can be disposed on a portion of the second passivation layer corresponding to the photodiode 230.

According to embodiments, the photodiode 230 can be formed in the crystalline semiconductor layer 200. Therefore, a fill factor can be increased by adopting a 3D image sensor where the photodiode 230 is located on the readout circuitry 120. Furthermore, since the photodiode 230 is formed inside a crystalline semiconductor layer 200, defects of the photodiode 230 can be reduced.

Also, since a device isolation region 240 separating the photodiode 230 for each unit pixel can be formed by implanting p-type impurities, defect generation inside the photodiode can be reduced and thus a dark current can be inhibited.

According to embodiments, a device is designed such that there is a potential difference between the source and drain of a transfer transistor Tx, so that a photo charge can be fully dumped. Therefore, as a photo charge generated from the photodiode is dumped to a floating diffusion region, the sensitivity of an output image can be increased.

That is, the electrical junction region 140 is formed in the first substrate 100 where the readout circuitry 120 is formed to allow a potential difference to be generated between the source and the drain at sides of the transfer transistor Tx 121, so that a photo charge can be fully dumped. In one embodiment, the readout circuitry 120 can include a transfer transistor Tx 121, a reset transistor Rx 123, a drive transistor Dx 125, and a select transistor Sx 127.

A dumping structure of a photo charge according to an embodiment is described in detail.

The electrical junction region 140 can include a first conduction type ion implantation layer 143 formed on a second conduction type well 141 (or a second conduction type epitaxial layer (not shown)), and a second conduction type ion implantation layer 145 formed on the first conduction type ion implantation layer 143. For example, the electrical junction region 140 can be, but is not limited to, a PN junction or a PNP junction.

Unlike a node of a floating diffusion FD 131, which is an N+ junction, the PNP junction 140, which is an electrical junction region 140 and to which an applied voltage is not fully transferred, is pinched-off at a predetermined voltage. This voltage is called a pinning voltage, which depends on P0 region 145 and N-region 143 doping concentrations.

Specifically, an electron generated from the photodiode 230 moves to the PNP junction 140, and is transferred to the node of the floating diffusion FD 131 and converted into a voltage when the transfer transistor Tx 121 is turned on.

Since a maximum voltage value of the P0/N-/P-well junction region 140 becomes a pinning voltage, and a maximum voltage value of the node of the floating diffusion FD 131 becomes Vdd minus a threshold voltage Vth of Rx 123, an electron generated from the photodiode 230 in the upper portion of a chip can be fully dumped to the node of the floating diffusion FD 131 without charge sharing by implementing a potential difference between the source and drain of the transfer transistor Tx 121.

That is, according to an embodiment, a P0/N-/P-well junction, not an N+/P-well junction, 30 is formed in the first substrate 100 to allow a + voltage to be applied to the N-region 143 of the P0/N-/P-well junction and a ground voltage to be applied to the P-well 141 during a 4-Tr active pixel sensor (APS) reset operation, so that a pinch-off is generated at the P0/N-/Pwell double junction at a predetermined voltage or more as in a bipolar junction transistor (BJT) structure. This is called a pinning voltage. Therefore, a potential difference is generated between the source and the drain of the transfer transistor Tx 121 to inhibit a charge sharing phenomenon during the on/off operations of the transfer transistor Tx.

Therefore, unlike a case where a photodiode is connected simply using an N+ junction as in a related art, limitations such as saturation reduction and sensitivity reduction can be avoided.

Next, a first conduction type connection region 147 can be formed between the photodiode and the readout circuitry to provide a swift movement path of a photo charge, so that a dark current source is minimized, and saturation reduction and sensitivity reduction can be inhibited.

For this purpose, the first conduction type connection region 147 for ohmic contact can be formed on the surface of the P0/N-/P-well junction 140. Meanwhile, to inhibit the first conduction type connection region 147 from becoming a leakage source, the width of the first conduction type connection region 147 can be minimized. By doing so, a dark current of the 3D image sensor can be reduced.

That is, a reason for locally and heavily doping only a contact forming portion with N type impurities according to an embodiment is to facilitate ohmic contact formation while minimizing a dark signal. In case of heavily doping the entire transfer transistor (Tx source), a dark signal can be increased by a Si surface dangling bond.

Reference numerals not explained in FIG. 11 are explained below in a manufacturing method thereof.

A method for manufacturing an image sensor is described with reference to FIGS. 1 to 11.

Figure 1:
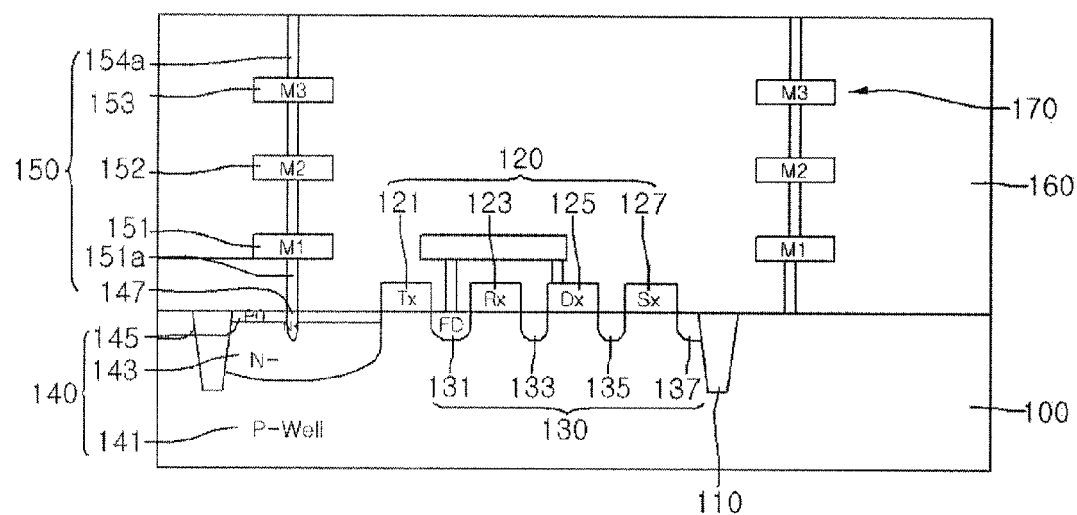
FIGS. 1 to 11 are cross-sectional views illustrating a process for manufacturing an image sensor according to an embodiment.

Referring to FIG. 1, a readout circuitry 120 can be formed on the first substrate 100.

A device isolation layer 110 defining an active region and a field region can be formed in the first substrate 100. The readout circuitry 120 including transistors can be formed on the active region of the first substrate 100. For example, the readout circuitry 120 can include the transfer transistor Tx 121, the reset transistor Rx 123, the drive transistor Dx 125, and the select transistor Sx 127. After forming gates of the transistors, the floating diffusion region FD 131 and ion implantation regions 130 including source/drain regions of the respective transistors can be formed.

The forming of the readout circuitry 120 on the first substrate 100 can include forming the electrical junction region 140 in the first substrate 100 and forming the first conduction type connection region 147 connected with the line 150.

The electrical junction region 140 can be, but is not limited to, a PN junction 140. For example, the electrical junction region 140 can include a first conduction type ion implantation layer 143 formed on a second conduction type well 141 (or a second conduction type epitaxial layer), and a second conduction type ion implantation layer 145 formed on the first conduction type ion implantation layer 143. Accordingly, the PN junction 140 can be, but is not limited to, the P0 (145)/N-(143)/P-(141) junction as shown in FIG. 1. In addition, the first substrate 100 can be, but is not limited to, a second conduction type substrate.

According to an embodiment, the electrical junction region 140 can be formed in the first substrate 100 where the readout circuitry 120 is formed to allow a potential difference to be generated between the source and the drain of the transfer transistor Tx 121, so that a photo charge can be fully dumped.

That is, according to an embodiment, a device is designed such that there is a potential difference between the source and drain of a transfer transistor Tx, so that a photo charge can be fully dumped. For example, a device can be designed such that a potential difference is generated between the source and drain of a transfer transistor Tx by making the doping concentration of the N-region 143 lower than the doping concentration of the floating diffusion region FD 131.

Next, according to an embodiment, the first conduction type connection region 147 for ohmic contact can be formed on the surface of the P0/N-/P-junction 140. For example, an N+ region 147 for ohmic contact can be formed on the surface of the P0/N-/P-junction 140. The N+ region 147 can be formed passing through the P0 region 145 to contact the N-region 143.

Meanwhile, to inhibit the first conduction type connection region 147 from becoming a leakage source, the width of the first conduction type connection region 147 can be minimized. For this purpose, a plug implant can be performed after etching a via hole for a first metal contact 151a. However, embodiments are not limited thereto. For example, ion implantation patterns (not shown) can be formed on the first substrate 100 and then the first conduction type connection region 147 can be formed using the ion implantation patterns as an ion implantation mask.

According to an embodiment, the first conduction type connection region 147 can be formed between the photodiode and the readout circuitry 120 to minimize a dark current source and inhibit saturation reduction and sensitivity reduction.

An interlayer dielectric 160 can be formed on the first substrate 100, and the line 150 can be formed. The line can include, but is not limited to, the first metal contact 151a, a first metal 151, a second metal 152, a third metal 153, and a fourth metal contact 154a.

The line 150 can be formed for each unit pixel to connect the photodiode 230, which will be described later, with the readout circuitry 120 and to transfer a photo charge of the photodiode 230. While the line 150 connected with the readout circuitry 120 is formed, a line 170 connected with a peripheral circuit region for signal processing can be simultaneously formed.

The line 150 can be formed of various conductive materials including metal, alloy, and silicide. For example, the line 150 can be formed of aluminum, copper, cobalt, or tungsten.

Figure 2:
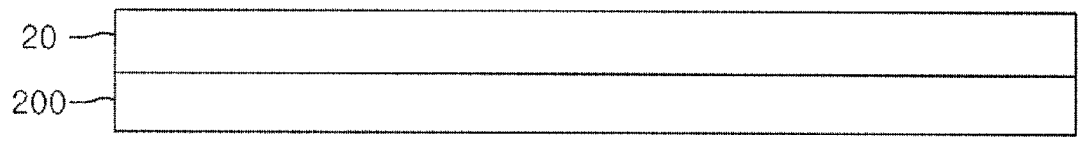

Referring to FIG. 2, a second substrate 20 including a crystalline semiconductor layer 200 can be prepared. The second substrate 20 can be a single crystal or polycrystal silicon substrate, and can be a substrate doped with p-type impurities or n-type impurities. The crystalline semiconductor layer 200 can be formed on the second substrate 20. For example, the crystalline semiconductor layer 200 can be formed on the second substrate 20 through epitaxial growing.

Though not shown, a hydrogen ion implantation layer can be formed by implanting hydrogen ions into a boundary between the second substrate and the crystalline semiconductor layer 200. The implantation of the hydrogen ions can be performed even after the ion implantation for the photodiode.

Figure 3:
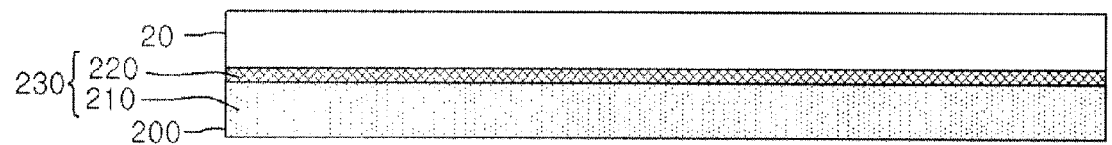

Referring to FIG. 3, a photodiode 230 can be formed inside the crystalline semiconductor layer 200. The photodiode 230 can include a first impurity region 210 and a second impurity region 220.

In an embodiment, the first impurity region 210 can be formed by implanting n-type impurities into a shallow region of the crystalline semiconductor layer 200 near a surface of the crystalline semiconductor layer 200. The second impurity region 220 can be formed by implanting p-type impurities into a deep region of the crystalline semiconductor layer 200. In one embodiment, the second impurity region 220 can be formed first and then the first impurity region 210 can be formed on the second impurity region 220. The second impurity region 220 and the first impurity region 210 provide a PN junction structure.

Figure 4:
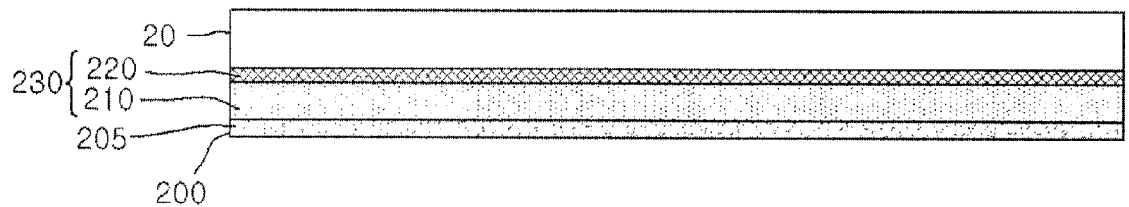

Referring to FIG. 4, an ohmic contact layer 205 can be additionally formed on the first impurity region 210 at a surface of the crystalline semiconductor layer 200. The ohmic contact layer 205 can be formed by implanting high concentration n-type impurities (n+). The ohmic contact layer 205 can lower contact resistance between the photodiode 230 and the line 150. Hereinafter, description is made using an example where the ohmic contact layer 205 under the photodiode 230 is omitted.

Figure 5:
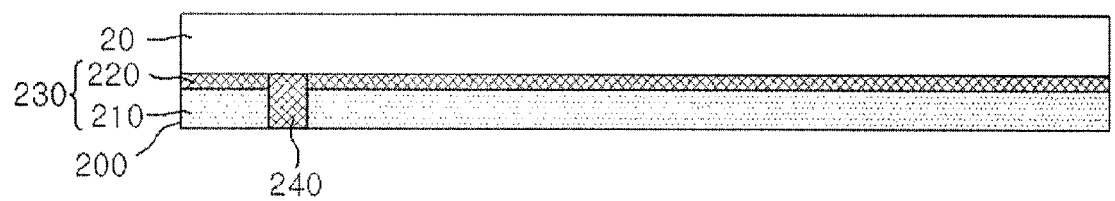

Referring to FIG. 5, a device isolation region 240 can be formed inside the crystalline semiconductor layer 200 to separate the photodiode 230 according to unit pixel. The device isolation region 240 can be formed by forming an ion implantation mask (not shown) on the crystalline semiconductor layer 200 and then performing an ion implantation. The ions implanted into the device isolation region 240 can be high concentration p-type impurities. Since the device isolation region 240 is formed using an ion implantation process, defect generation inside the photodiode 230 can be reduced and thus a dark current characteristic can be resolved.

Figure 6:
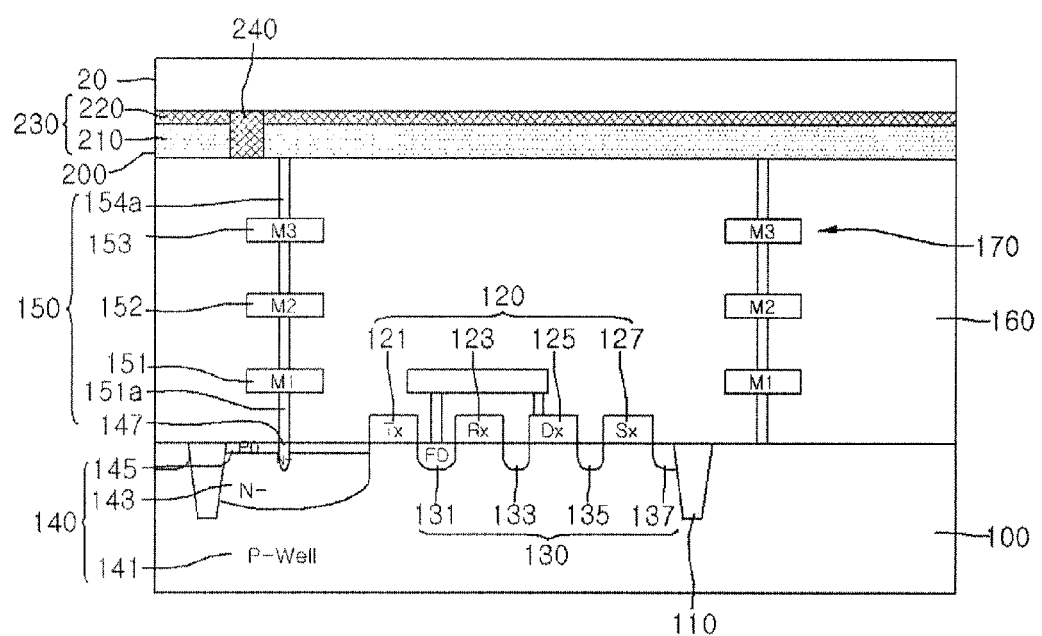

Referring to FIG. 6, the first substrate 100 and the second substrate 20 including the crystalline semiconductor layer 200 can be bonded to each other. Particularly, the first substrate 100 and the second substrate 20 can be bonded to each other such that the photodiodes 230 separated for unit pixels correspond to respective ones of the lines 150. At this point, before the first substrate 100 and the second substrate 20 are bonded to each other, the bonding can be performed by increasing the surface energy of a surface bonded by activation of plasma. Meanwhile, in certain embodiments, the bonding can be performed with a dielectric or a metal layer disposed on a bonding interface to improve bonding force.

When the first substrate 100 and the second substrate 20 are bonded, the fourth metal contact 154a and the first impurity region 210 of the photodiode 230 can be connected with each other. Therefore, a photo charge generated from the photodiode 230 can be transferred to the readout circuitry 120 through the line 150.

Particularly, the photodiodes 230 separated for respective unit pixels by the device isolation region 240 can be connected to respective fourth metal contacts 154a disposed for the respective unit pixels in the first substrate 100.

After that, though not shown, for embodiments incorporating a hydrogen ion implantation layer, the hydrogen ion implantation layer can be changed into a hydrogen gas layer by performing a heat treatment.

Figure 7:
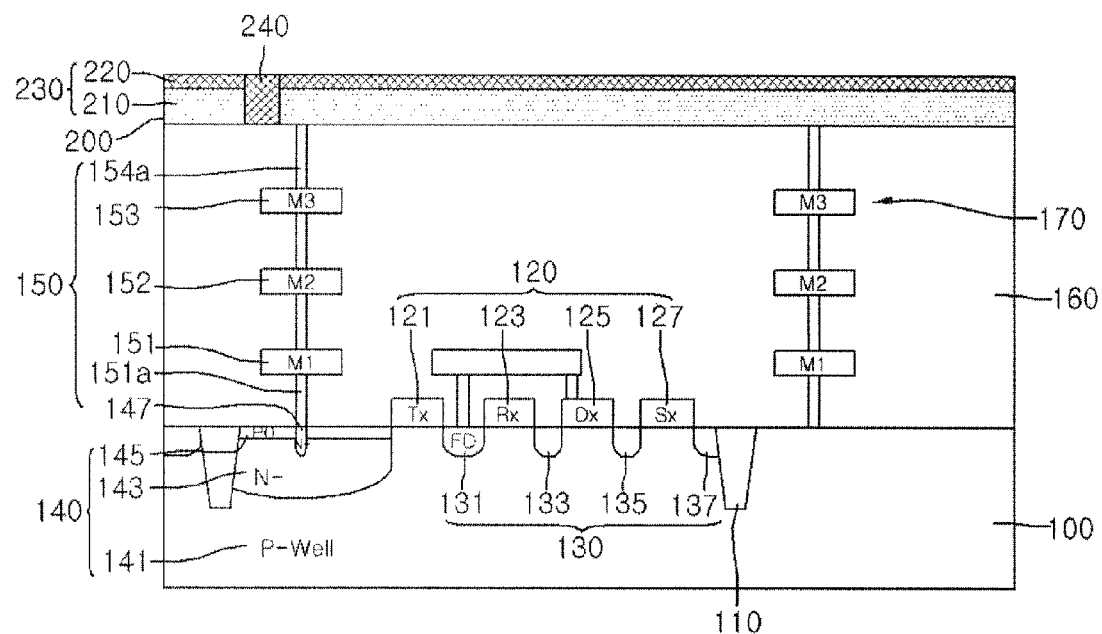

Referring to FIG. 7, the second substrate 20 can be removed such that the crystalline semiconductor layer 200 remains on the first substrate 100. That is, a portion of the second substrate 20 can be removed using a blade with the photodiodes 230 remaining on the first substrate 100 by using the hydrogen gas layer (not shown) as a reference, so that the photodiodes 230 can be exposed.

Therefore, the crystalline semiconductor layer 200 including the photodiodes 230 and the device isolation region 240 can be left on the first substrate 100.

Figure 8:
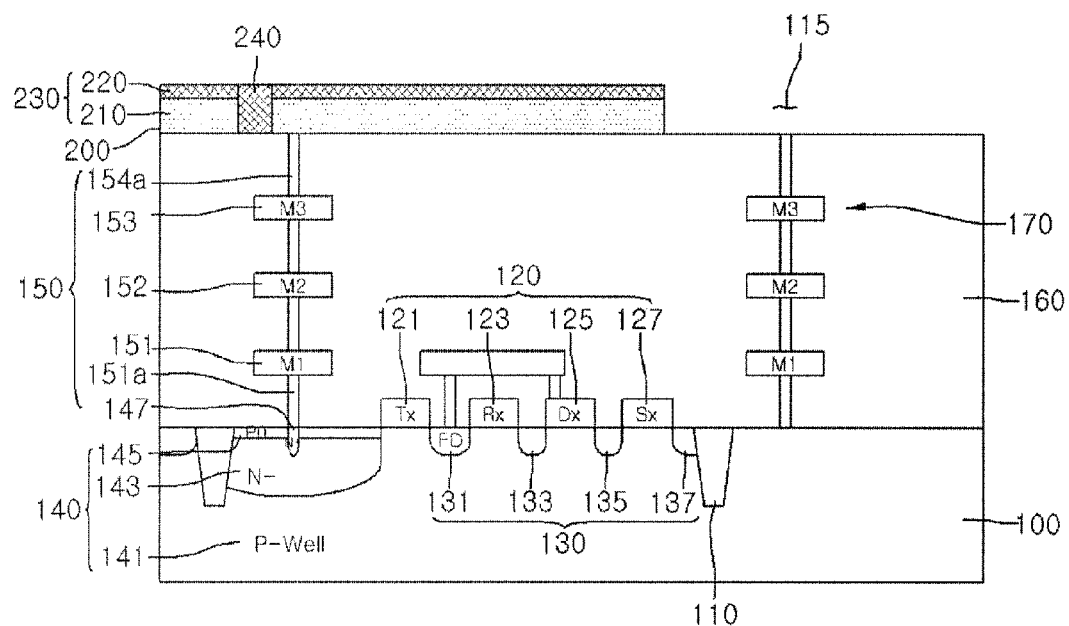

Referring to FIG. 8, an expose portion 115 exposing portions of the interlayer dielectric 160 and a line 170 of the peripheral region can be formed by removing a portion of the crystalline semiconductor layer 200. At this point, the lateral side of the photodiode 230 located at an outer region of the chip can also be exposed.

Figure 9:
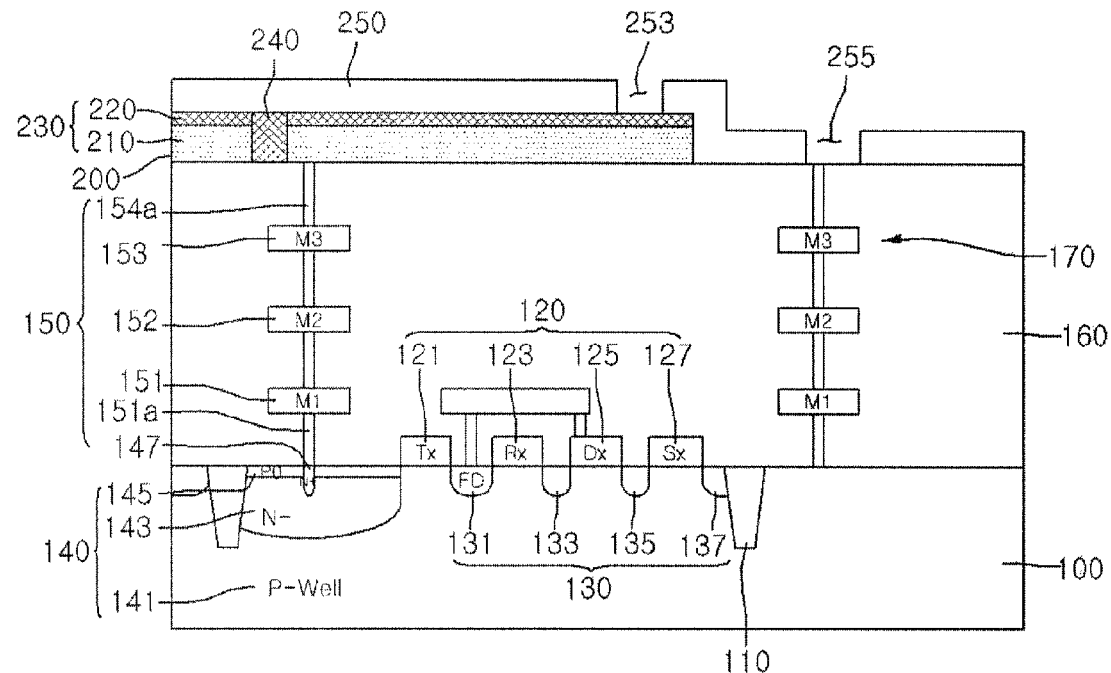

Referring to FIG. 9, a first passivation layer 250 including a first trench 253 can be formed on the interlayer dielectric 160 on which the crystalline semiconductor layer 200 and the expose portion 115 are formed. The first passivation layer 250 can be formed by depositing an oxide layer or a nitride layer on the interlayer dielectric 160 on which the photodiode 230 is formed.

The first trench 253 can be formed in the first passivation layer 250 using a photolithography process and an etching process to selectively expose the surface of the photodiode 230. The first trench 253 can be formed on an edge region of the photodiode 230 so that it may not screen the light receiving region of the photodiode 230. Also, a second trench 255 can be simultaneously formed to expose the line 170 of the peripheral circuit region while the first trench 253 is formed.

Figure 10:
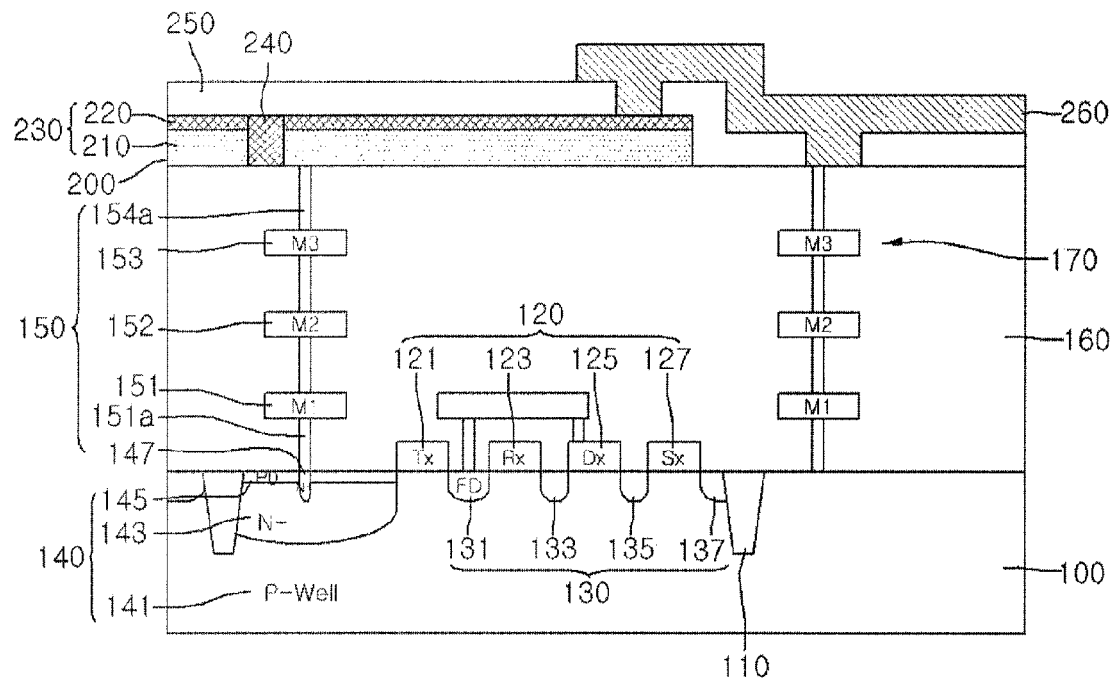

Referring to FIG. 10, an upper electrode 260 can be formed on the first passivation layer 250 including in the first trench 253. The upper electrode 260 can be formed in the first trench 253 so that it can be electrically connected with the photodiode 230.

Since the upper electrode 260 is selectively connected with a portion of the photodiode 230 through the first trench 253, the upper electrode 260 can be formed so that it may not screen light incident to the photodiode 230. Also, the upper electrode 260 can be connected with the line 170 of the peripheral circuit region through the second trench 255. Also, since the upper electrode 260 screens the lateral side of the photodiode 230, it can block light. In certain embodiments, the upper electrode 260 can be formed of various conductive materials including aluminum, copper, titanium, and tungsten.

Referring to FIG. 11, a second passivation layer 270 can be formed on the first passivation layer 250 and the upper electrode 260. For example, the second passivation layer 270 can be a nitride layer or an oxide layer.

Also, a color filter 280 can be formed on a portion of the second passivation layer 270 corresponding to the photodiode 230 for each unit pixel.

Figure 12:
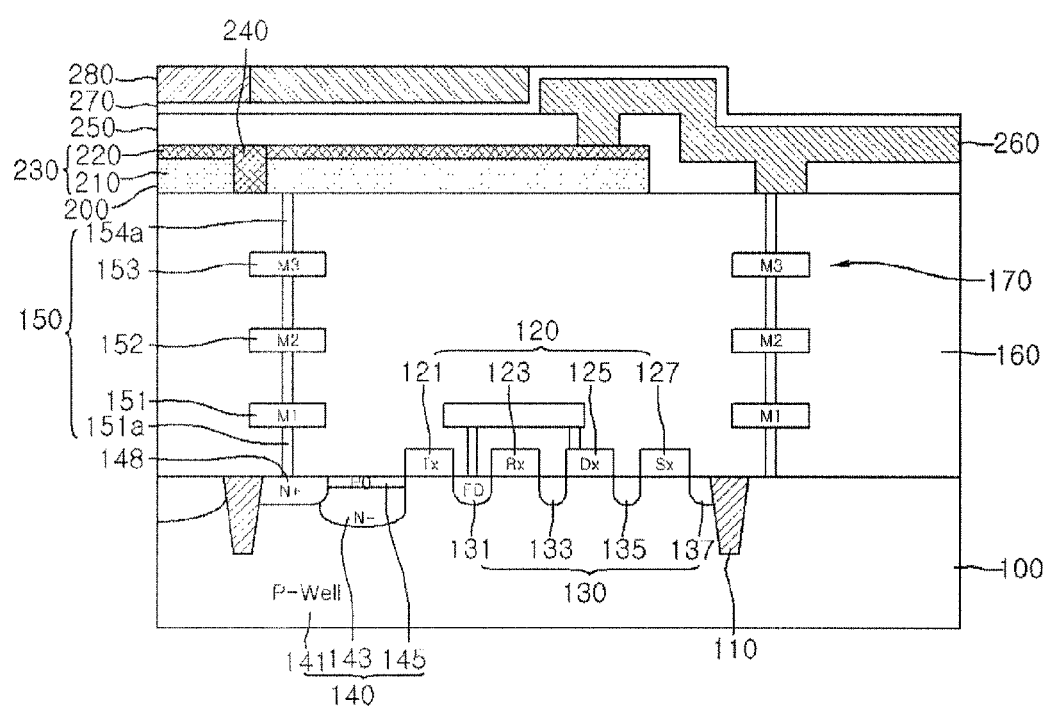
FIG. 12 is a cross-sectional view of an image sensor according to another embodiment.

FIG. 12 is a cross-sectional view of an image sensor according to another embodiment.

Referring to FIG. 12, an image sensor can include: a first substrate 100 including a line 150 and a readout circuitry 120; and a crystalline semiconductor layer 200 including a photodiode and a device isolation region formed on the readout circuitry 120. The readout circuitry 120 of the first substrate 100 can include: an electrical junction region 140 formed in the first substrate 100; and a first conduction type connection region 148 connected with a line 150 at one side of the electrical junction region 140.

The embodiment as shown in FIG. 12 can adopt the technical characteristic of the embodiments described with respect to FIGS. 1 to 11.

According to the embodiment as shown in FIG. 12, a device is designed such that there is a potential difference between the source and drain of a transfer transistor Tx, so that a photo charge can be fully dumped. Therefore, as a photo charge generated from the photodiode is dumped to a floating diffusion region, the sensitivity of an output image can be increased.

Also, according to an embodiment, a charge connection region is formed between the photodiode and the readout circuitry to provide a swift movement path of a photo charge, so that a dark current source is minimized, and saturation reduction and sensitivity reduction can be inhibited.

Meanwhile, unlike an embodiment described with respect to FIG. 11, this embodiment provides a first conduction type connection region 148 in the first substrate 100 at one side of the electrical junction region 140.

According to an embodiment, an N+ connection region 148 for ohmic contact can be formed on the P0/N-/P-junction 140. At this point, a process of forming the N+ connection region 148 and an MIC contact 151a may provide a leakage source because the device operates with a reverse bias applied to the P0/N-/P-junction 140 and so an electric field EF can be generated on the Si surface. A crystal defect generated during the contact forming process inside the electric field serves as a leakage source.

Also, according to an embodiment, in the case where the N+ connection region 148 is formed on the surface of the P0/N-/P-junction 140, an electric field due to the N+/P0 junction 148/145 is added. This electric field also serves as a leakage source.

Therefore, a layout is provided in which a first contact plug 151a is formed in an active region not doped with a P0 layer but including an N+ connection region 148. Then, the first contact plug 151a is connected with the N-junction 143 through the N+ connection region 148.

According to embodiments, the electric field is not generated on the Si surface, which can contribute to reduction in a dark current of a 3D integrated CIS.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An image sensor comprising:
    a first substrate comprising a readout circuitry;
    an interlayer dielectric on the first substrate;
    lines passing through the interlayer dielectric to connect with the readout circuitry, the lines being formed for each unit pixel;
    a crystalline semiconductor layer on the interlayer dielectric;
    photodiodes inside the crystalline semiconductor layer, the photodiodes being electrically connected with the lines; and
    a device isolation region comprising conductive impurities, the device isolation region being provided inside the crystalline semiconductor layer so that the photodiodes are separated according to unit pixels.

2. The image sensor according to claim 1, wherein the readout circuitry comprises an electrical junction region in the first substrate electrically connected to a respective line of the lines, wherein the electrical junction region comprises:
    a first conduction type ion implantation region in the first substrate; and
    a second conduction type ion implantation region on the first conduction type ion implantation region.

3. The image sensor according to claim 2, further comprising a first conduction type connection region electrically connected with the respective line on the electrical junction region.

4. The image sensor according to claim 2, further comprising a first conduction type connection region electrically connected with the respective line at one side of the electrical junction region.

5. The image sensor according to claim 1, wherein a potential difference is provided between a source and a drain of a transistor of the readout circuitry.

6. The image sensor according to claim 5, wherein the transistor comprises a transfer transistor, and an ion implantation concentration of the source of the transistor is smaller than an ion implantation concentration of a floating diffusion region at the drain of the transistor.

7. The image sensor according to claim 1, further comprising:
    a passivation layer formed of a dielectric on the photodiode, wherein the passivation layer comprises a trench selectively exposing the photodiode; and
    an upper electrode on the passivation layer and connected with the photodiode through the trench.

8. The image sensor according to claim 1, wherein the photodiode comprises:
    a first impurity region in a portion of the crystalline semiconductor layer, the first impurity region being connected with the lines; and
    a second impurity region on the first impurity region.

9. The image sensor according to claim 8, wherein the device isolation region and the second impurity region are formed of the same material.

10. The image sensor according to claim 8, further comprising an ohmic contact layer under the first impurity region, the ohmic contact layer being formed of high concentration n-type impurities.

11. A method for manufacturing an image sensor according to claim 1, the method comprising:
    forming the readout circuitry on the first substrate;
    forming the interlayer dielectric on the first substrate;
    forming a line connected with the readout circuitry in the interlayer dielectric;
    preparing a second substrate comprising the crystalline semiconductor layer;
    forming the photodiodes inside the crystalline semiconductor layer;
    implanting conductive impurities into the crystalline semiconductor layer to form the device isolation region such that the photodiodes are separated according to unit pixels;
    bonding the first substrate and the second substrate so that the line of the first substrate is electrically connected with one of the photodiodes of the crystalline semiconductor layer; and
    removing a portion of the second substrate such that the crystalline semiconductor layer remains on the first substrate.

12. The method according to claim 11, wherein the forming of the readout circuitry comprises forming an electrical junction region in the first substrate, wherein the forming of the electrical junction region comprises:
    forming a first conduction type ion implantation region in the first substrate; and
    forming a second conduction type ion implantation region on the first conduction type ion implantation region.

13. The method according to claim 12, further comprising forming a first conduction type connection region in the first substrate connected with the line on the electrical junction region.

14. The method according to claim 13, wherein the forming of the first conduction type connection region is performed after a contact etch for the line.

15. The method according to claim 12, further comprising forming a first conduction type region in the first substrate connected with the line at one side of the electrical junction region.

16. The method according to claim 11, further comprising:
    forming a passivation layer on the photodiode;
    forming a trench in the passivation layer to selectively expose the photodiode; and
    forming an upper electrode in the trench to electrically connect with the photodiode.

17. The method according to claim 16, wherein the upper electrode contacts a portion of an edge region of the photodiode.

18. The method according to claim 11, wherein the forming of the photodiodes comprises:
    forming a first impurity region inside the crystalline semiconductor layer; and
    forming a second impurity region inside the crystalline semiconductor layer.

19. The method according to claim 18, further comprising forming an ohmic contact layer on the first impurity region.

20. The method according to claim 18, wherein the second impurity region comprises the same type of conductive impurities as the device isolation region.

* * * * *